US009570438B1

(12) United States Patent
Curatola et al.

(10) Patent No.: US 9,570,438 B1
(45) Date of Patent: Feb. 14, 2017

(54) AVALANCHE-RUGGED QUASI-VERTICAL HEMT

(71) Applicant: Infineon Technologies Austria AG, Villach (AT)

(72) Inventors: Gilberto Curatola, Villach (AT); Ralf Siemieniec, Villach (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/817,835

(22) Filed: Aug. 4, 2015

(51) Int. Cl.
| H01L 27/06 | (2006.01) |
| H01L 29/10 | (2006.01) |
| H01L 29/778 | (2006.01) |
| H01L 29/20 | (2006.01) |
| H01L 29/205 | (2006.01) |
| H01L 29/84 | (2006.01) |
| H01L 29/808 | (2006.01) |
| H01L 29/872 | (2006.01) |
| H01L 21/02 | (2006.01) |

(Continued)

(52) U.S. Cl.
CPC ....... *H01L 27/0629* (2013.01); *H01L 21/0254* (2013.01); *H01L 21/02529* (2013.01); *H01L 21/76898* (2013.01); *H01L 21/8258* (2013.01); *H01L 27/0617* (2013.01); *H01L 29/1095* (2013.01); *H01L 29/1608* (2013.01); *H01L 29/2003* (2013.01); *H01L 29/205* (2013.01); *H01L 29/66143* (2013.01); *H01L 29/66462* (2013.01); *H01L 29/66909* (2013.01); *H01L 29/7787* (2013.01); *H01L 29/8083* (2013.01); *H01L 29/84* (2013.01); *H01L 29/872* (2013.01)

(58) Field of Classification Search
CPC .. H01L 27/06; H01L 27/0629; H01L 27/0688; H01L 29/7835; H01L 25/074
See application file for complete search history.

(56) References Cited

U.S. PATENT DOCUMENTS 8,575,651 B2   11/2013  Saxler et al.
2004/0183583 A1*  9/2004  Mizuno ................ H03K 17/693
                                         327/389

(Continued)

OTHER PUBLICATIONS

Ostermaier, C. et al., "Method of Manufacturing a High Breakdown Voltage III-Nitride Device", U.S. Appl. No. 14/730,536, filed Jun. 4, 2015, pp. 1-27.

*Primary Examiner* — Phuc Dang
(74) *Attorney, Agent, or Firm* — Murphy, Bilak & Homiller, PLLC

(57) ABSTRACT

A semiconductor device includes a semiconductor body including first and second lateral surfaces. A first device region includes a drift region of a first conductivity type, and a drift current control region of a second conductivity type being spaced apart from the second lateral surface by the drift region. A second device region includes a barrier layer, and a buffer layer having a different band gap than the barrier layer so that a two-dimensional charge carrier gas channel arises along an interface between the buffer layer and the barrier layer. An electrically conductive substrate contact forms a low ohmic connection between the two-dimensional charge carrier gas channel and the drift region. A gate structure is configured to control a conduction state of the two-dimensional charge carrier gas. The drift current control region is configured to block a vertical current in the drift region via a space-charge region.

27 Claims, 7 Drawing Sheets

(51) Int. Cl.
*H01L 21/768* (2006.01)
*H01L 29/66* (2006.01)
*H01L 29/16* (2006.01)
*H01L 21/8258* (2006.01)

(56) References Cited

U.S. PATENT DOCUMENTS

| | | | |
|---|---|---|---|
| 2009/0078971 | A1 | 3/2009 | Treu et al. |
| 2013/0256680 | A1 | 10/2013 | Chiu et al. |
| 2013/0264654 | A1* | 10/2013 | Weis .................... H03K 17/102 257/392 |
| 2014/0008658 | A1 | 1/2014 | Siemieniec et al. |
| 2015/0070049 | A1* | 3/2015 | Laurent ............... G06F 17/5022 326/93 |
| 2015/0333158 | A1* | 11/2015 | Tsuchiko .......... H01L 29/66893 438/188 |

* cited by examiner

AVALANCHE-RUGGED QUASI-VERTICAL HEMT

TECHNICAL FIELD

The instant application relates to power transistors, and in particular relates to high electron mobility power transistors with high breakdown voltage ratings.

BACKGROUND

Semiconductor transistors, in particular field-effect controlled switching devices such as a MISFET (Metal Insulator Semiconductor Field Effect Transistor), in the following also referred to as MOSFET (Metal Oxide Semiconductor Field Effect Transistor) and a HEMT (high-electron-mobility Field Effect Transistor) also known as heterostructure FET (HFET) and modulation-doped FET (MODFET) are used in a variety of applications. An HEMT is a transistor with a junction between two materials having different band gaps, such as GaN and AlGaN.

In a GaN/AlGaN based HEMT, a two-dimensional electron gas (2DEG) arises at the interface between the AlGaN barrier layer and the GaN buffer layer. In an HEMT, the 2DEG forms the channel of the device instead of a doped region, which forms the channel in a conventional MOSFET device. Similar principles may be utilized to select buffer and barrier layers that form a two-dimensional hole gas (2DHG) as the channel of the device. A 2DEG or a 2DHG is generally referred to as a two-dimensional carrier gas. Without further measures, the heterojunction configuration leads to a self-conducting, i.e., normally-on, transistor. Typically, measures must be taken to prevent the channel region of an HEMT from being in a conductive state in the absence of a positive gate voltage.

HEMTs are viewed as an attractive candidate for power transistor applications. A power transistor is a device that is capable of switching substantial voltages and/or currents associated with high power applications. For example, a power transistor may be required to block a voltage of at least 200 V, 400 V, 600 V or more. In addition, a power transistor may be required to conduct currents in the range of ones, tens or hundreds of amperes during normal operation. Due to the high electron mobility of the two-dimensional carrier gas in the heterojunction configuration, HEMTs offer high conduction and low losses in comparison to many conventional semiconductor transistor designs and therefore are well suited for these large operating currents.

Known HEMT designs have a number of limitations that detrimentally impact their suitability for power transistor applications. One limitation of GaN technology relates to the breakdown strength of a GaN/AlGaN based HEMT. Conventionally, the breakdown strength of a GaN/AlGaN based HEMT can be improved by increasing the thickness of the GaN buffer layer. However, this technique introduces cost and complexity to the manufacturing process. Other issues with HEMT designs include poor dynamic on-resistance, current collapse and reliability concerns, e.g., due to the high electric fields between source and drain fingers at the surface of the devices due to the inherent lateral structure of the HEMT.

SUMMARY

A semiconductor device is disclosed. According to an embodiment, the semiconductor device includes a semiconductor body including a first lateral surface and a second lateral surface opposite the first lateral surface. A first device region extends to the second lateral surface, and includes a drift region of a first conductivity type, and a drift current control region of a second conductivity type that is opposite the first conductivity type, the drift current control region being spaced apart from the second lateral surface by the drift region. A second device region extends to the first lateral surface, and includes a barrier layer, and a buffer layer having a different band gap than the barrier layer so that a two-dimensional charge carrier gas channel arises along an interface between the buffer layer and the barrier layer. An electrically conductive substrate contact forms a low ohmic connection between the two-dimensional charge carrier gas channel and the drift region. A gate structure is configured to control a conduction state of the two-dimensional charge carrier gas. The drift current control region is configured to block a vertical current in the drift region via a space-charge region that arises at a p-n junction between the drift current control region and the drift region.

A transistor arrangement is disclosed. According to an embodiment, the transistor arrangement includes a semiconductor body including a first lateral surface and a second lateral surface opposite the first lateral surface. The transistor arrangement further includes a vertical JFET, including a first conductivity type drift region, and a drift current control region of a second conductivity type that is opposite the first conductivity type. The transistor arrangement further includes a lateral high-electron-mobility transistor, including a barrier layer, and a buffer layer having a different band gap than the barrier layer so that a two-dimensional charge carrier gas arises along an interface between the buffer layer and the barrier layer. An electrically conductive substrate contact forms an ohmic connection between the two-dimensional charge carrier gas and the drift region. An HEMT gate is configured to control a lateral current in the two-dimensional charge carrier gas channel. A JFET gate is configured to control a vertical current in the drift region.

A method of forming a semiconductor device in a semiconductor body including a first lateral surface and a second lateral surface opposite the first lateral surface is disclosed. According to an embodiment, the method includes forming a first device region, including a drift region of a first conductivity type, and a drift current control region of a second conductivity type that is opposite the first conductivity type, the drift current control region being spaced apart from the second lateral surface by the drift region. A second device region is formed on the first device region. The second device region includes a barrier layer, and a buffer layer having a different band gap than the barrier layer so that a two-dimensional charge carrier gas channel arises along an interface between the buffer layer and the barrier layer. An electrically conductive substrate contact is formed in the semiconductor body. The electrically conductive substrate contact forms an ohmic connection between the two-dimensional charge carrier gas channel and the drift region. A gate structure is formed on the semiconductor body, the gate structure being configured to control a conduction state of the two-dimensional charge carrier gas. The first device region adjoins the second lateral surface and the second device region adjoins the first lateral surface. The drift current control region is formed such that a space-charge region that arises at a p-n junction between the drift current control region and the drift region is configured to block a vertical current in the drift region.

A circuit is disclosed. According to an embodiment, the circuit includes a JFET, a high-electron-mobility transistor, and a diode connected between output terminals of the JFET and the high-electron-mobility transistor. A drain of the high-electron-mobility transistor is connected to a source of the JFET. A gate of the JFET is connected to the source of the high-electron-mobility transistor. A pinch-off voltage of the JFET is lower than a breakdown voltage of the high-electron-mobility transistor.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

Figure 1:
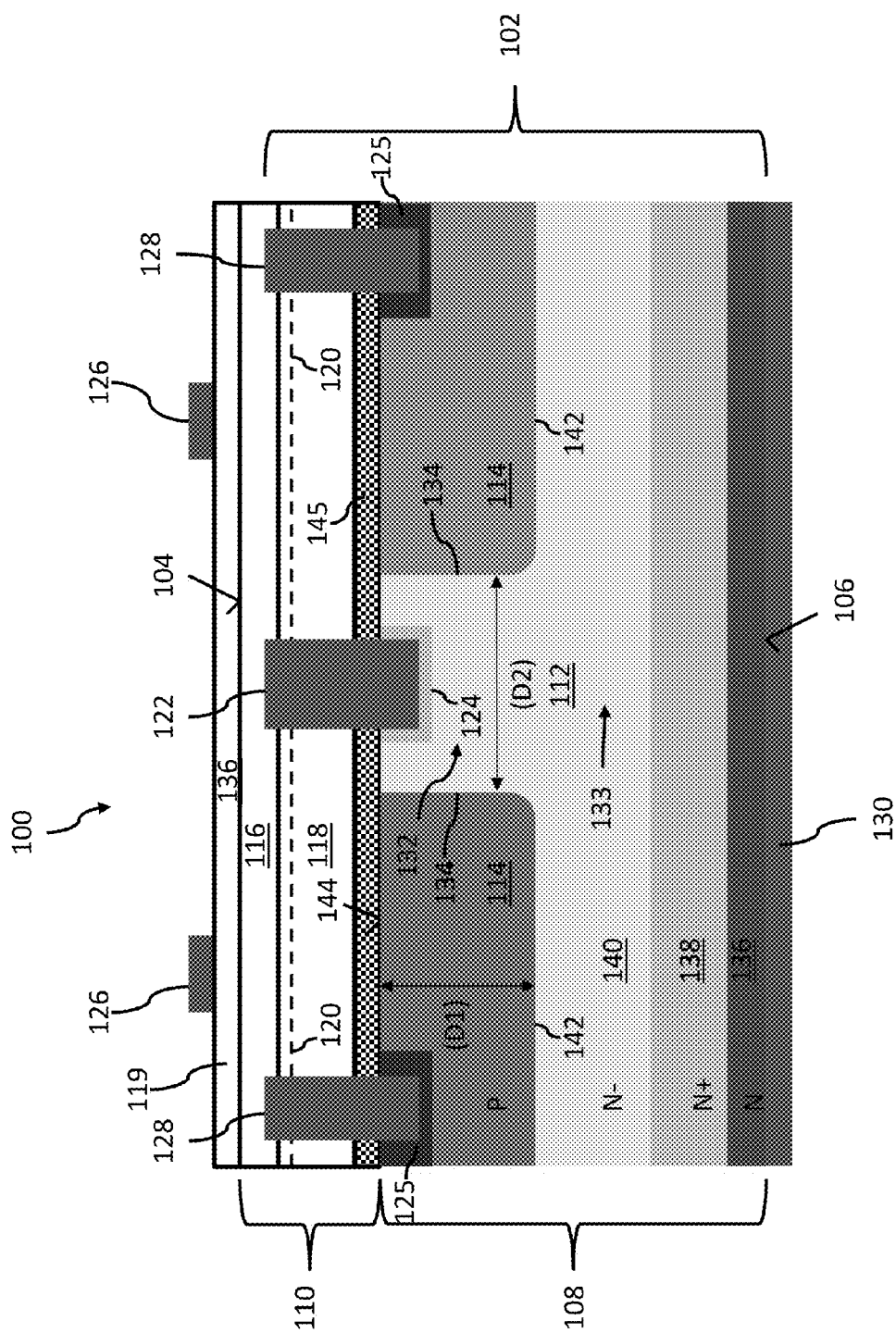
FIG. 1 illustrates a quasi-vertical transistor that includes a vertical JFET and a lateral high-electron-mobility transistor, according to an embodiment.

Embodiments described herein include a power transistor that is formed from a lateral HEMT and a vertical NET that are integrated into a single substrate. The power transistor is formed in a compound substrate consisting of material layers that are ideally suited for these two transistor devices. For example, the vertical JFET layer may be formed in an SiC region, whereas the lateral HEMT device may be formed in a GaN region. The power transistor is a "vertical" device in the sense that the output terminals of the power transistor (e.g., the source and drain terminals) are arranged on opposite sides of the substrate and the power transistor controls a current flowing between the two. The power transistor is "quasi-vertical" in the sense that there is both a lateral current path and a vertical current path. The HEMT controls the lateral current path, which extends along a heterojunction parallel to a first lateral surface of the semiconductor body. The NET controls the vertical current path, which extends through a drift layer in a perpendicular direction of the semiconductor body.

The power transistor design offers many advantages in comparison to conventional GaN based power transistor designs and/or conventional SiC based power transistor designs. One notable advantage is the ability to independently adjust the parameters of the HEMT and the JFET. The JFET can be tailored to achieve a high reverse voltage rating. Because the JFET includes a relatively thick SiC region that forms the drift layer of the device, the material parameters of the JFET mitigate avalanche breakdown and therefore achieve a very high reverse blocking capability (e.g., 600V or more). Meanwhile, the physical parameters of the HEMT device (e.g., buffer layer thickness, doping concentration, etc.) can be optimized for forward conduction performance without suffering from a tradeoff with respect to reverse voltage rating. Further, the SiC that may be used to form the JFET offers the advantage of a high quality substrate material for the epitaxial growth of GaN material, which forms the HEMT. The quality and defect density of the GaN material for the HEMT is much improved in comparison to other substrate materials, such as Silicon. In addition, the growth process of the GaN layer itself is eased. Furthermore, a very thin layer of GaN (e.g., less than 1 μm) can be used as the buffer layer, which provides a cost benefit in comparison to the thicknesses of 5-6 μm that are used in conventional 600V rated devices.

The gate region of the JFET, which is oppositely doped from the drift region, can be provided directly underneath the HEMT buffer layer so as to also shield the HEMT device from the large electric fields that can develop across the drift region. Avalanche breakdown will occur, if at all, within the gate region of the JFET. This improves the avalanche ruggedness of the device. This dramatically improves the current collapse and dynamic $R_{DSON}$ behavior of the device. Many more advantages will become apparent to those of ordinary skill in view of the following description.

Referring to FIG. 1, a semiconductor device 100 is depicted. The semiconductor device 100 is formed from a semiconductor body 102 having a first lateral surface 104 and a second lateral surface 106 that is spaced apart from and opposite to the first lateral surface 104.

The semiconductor body 102 includes a first device region 108 and a second device region 110. The first and second device regions 108, 110 are vertically layered on top of one another. The first device region 108 extends to the second lateral surface 106. That is, a lower side of the first device region 108 forms a common boundary with the semiconductor body 102 at the second lateral surface 106. The second device region 110 extends to the first lateral surface 104. That is, an upper side of the second device region 110 forms a common boundary with the semiconductor body 102 at the first lateral surface 104. According to an embodiment, the first and second device regions 108, 110 directly adjoin one another at a lateral interface within the semiconductor body 102.

The first device region 108 includes a drift region 112 of a first conductivity type and a drift current control region 114 of a second conductivity type that is opposite the first conductivity type. For example, the drift region 112 may be an N-type region and the drift current control region 114 may be a P-type region. The drift current control region 114 is spaced apart from the second lateral surface 106 by the drift region 112. That is, the drift region 112 is interposed between the drift current control region 114 and the second lateral surface 106.

The second device region 110 includes a barrier layer 116 and a buffer layer 118. The buffer layer 118 is formed from a semiconductor material having a different band gap than the semiconductor material that is used to form the barrier layer 116. That is, the second device region 110 includes a heterojunction. The presence of piezoelectric and/or spontaneous polarization charges between the two materials (depending upon the material system) results in a two-dimensional charge carrier gas channel 120 that arises along an interface between the buffer layer 118 and the barrier layer 116. According to an embodiment, the buffer layer 118 is a layer of GaN and the barrier layer 116 is a layer of AlGaN.

The semiconductor device 100 includes an electrically conductive substrate contact 122. According to an embodiment, the substrate contact 122 extends from the first lateral surface 104 through the second device region 110 (i.e., through the barrier and buffer layers 116, 118) and into the first device region 108. The electrically conductive substrate contact 122 is formed from an electrically conductive material, such as polysilicon, copper, aluminum, titanium or any suitable alloy. The substrate contact 122 forms a low resistance connection between the two-dimensional charge carrier gas channel 120 and the drift region 112. For example, the substrate contact 122 may directly adjoin the two-dimensional charge carrier gas channel 120 and the drift region 112 so as to provide a low-ohmic connection between the two. A highly doped contact region 124 of the first conductivity type may be interposed between the substrate contact 122 and the first device region 108 so as to lower the contact resistance between the substrate contact 122 and the drift region 112. Furthermore, a silicide may be provided between the between the substrate contact 122 and the drift region 112 to improve the contact resistance.

The semiconductor device 100 further includes an electrically conductive gate electrode 126, a first electrically conductive output contact 128, and a second electrically conductive output contact 130. A highly doped contact region 125 of the second conductivity type may be interposed between the first electrically conductive output contacts 128 and the drift current control region 114 so as to lower the contact resistance between the first electrically conductive output contacts 128 and the drift current control region 114.

The gate electrode 126 and the first and second output contacts 128, 130 are formed from an electrically conductive material, such as polysilicon, copper, aluminum, titanium or any of a variety of alloy materials (Au, TiN, TaN, Ti, Ni, Mo, W and any suitable combination). The gate electrode 126 and the first output contact 128 are formed on the first lateral surface 104 and the second output contact 130 is formed on the second lateral surface 106. As shown in FIG. 1, the gate electrode 126 is arranged above the first lateral surface 104, whereas the first output contact 128 penetrates into the semiconductor body 102. This is one example configuration, and a variety of contact configurations can be implemented to achieve the required electrical connectivity. According to an embodiment, the first contact output contact 128 is in ohmic contact with the two-dimensional charge carrier gas channel 120 and the drift current control region 114. As shown in FIG. 1, the first output contact 128 may be formed in a recess (e.g., an etched opening) extending into the semiconductor body 102 such that the electrically conductive substrate contact 122 directly contacts both the two-dimensional charge carrier gas channel 120 and the drift current control region 114.

The working principle of a quasi-vertical transistor that is formed by semiconductor device 100 of FIG. 1 will now be discussed. The first and second output contacts 128, 130 may form the source and drain terminals of the quasi-vertical transistor, respectively. The quasi-vertical transistor utilizes two series connected transistors to control a current flow between the first and second output contacts 128, 130.

A first transistor is formed by a vertical JFET that is disposed in the first device region 108. The vertical JFET is formed by the drift current control region 114 and a first vertical section 132 of the drift region 112. The first vertical section 132 of the drift region 112 is laterally adjacent to the drift current control region 114. Further, the first vertical section 132 of the drift region 112 is in ohmic contact with the substrate contact 122 either by direct physical contact or by the optional contact region 124. A space charge region (i.e., a depletion region) arises at the p-n junction 134 between the drift current control region 114 and the drift region 112. The space charge region that forms in the first vertical section 132 of the drift region 112 can be modulated to control the flow of carriers in the drift region 112. A reverse bias of sufficient magnitude applied to this p-n junction 134 will cause the space charge region to laterally expand across the first vertical section 132 of the drift region 112 and to disrupt current flow in the drift region 112. In this way, the drift current control region 114 provides a gate for the vertical JFET. The first vertical section 132 may have the same doping concentration as a subjacent portion 133 of the drift region 112. Alternatively, the first vertical section 132 may have a doping concentration that is at least two times higher than the doping concentration of the subjacent portion 133 of the drift region 112. This higher doping concentration enhances the current spreading capability of the first vertical section 132 and thus reduces the on-state resistance of the vertical JFET.

A second transistor is formed by a lateral HEMT that is disposed in the second device region 110. The gate of this lateral HEMT is provided by the gate electrode 126. The gate electrode 126 is disposed directly over the two-dimensional charge carrier gas channel 120 such that a conductive state of the two-dimensional charge carrier gas channel 120 can be influenced by the gate electrode 126. A suitable bias applied to the gate electrode 126 will complete or disrupt a conductive path between the first output contact 128 and the substrate contact 122. In this sense, the substrate contact 122 provides the "drain" of the lateral HEMT. Optionally, as shown in FIG. 1, the device 100 can be configured with two of the lateral HEMTs in a common drain configuration.

The quasi-vertical transistor is thus configured to control a current flowing between the first output contact 128 and the second output contact 130 by the two distinct transistor devices (i.e., the vertical JFET and the lateral HEMT) described above. The current in this this quasi-vertical transistor is collectively controlled by the gate of the lateral HEMT and the gate of the vertical JFET. The quasi-vertical transistor is only "ON" (i.e., providing a conductive connection between the first and second output contacts 128, 130) if both the vertical JFET and lateral HEMT are turned "ON."

A method for forming the semiconductor device 100 of FIG. 1 will now be discussed. According to the method, the first device region 108 is formed, either partially or completely, by an epitaxial growth process. One embodiment of an epitaxial growth process includes providing a first conductivity type substrate 136. The substrate 136 may be provided from a bulk semiconductor material or alternatively may be formed from an epitaxially grown layer. Subsequently, a first conductivity type field stop layer 138 is epitaxially grown on the substrate 136. The field stop layer 138 has a lower doping concentration than the substrate 136. Subsequently, a first conductivity type drift layer 140 is epitaxially grown on the field stop layer 138. The drift layer 140 has a lower doping concentration than the field stop layer 138. The drift layer 140 and the field stop layer 138 collectively form a first compound epitaxial layer, i.e., a stack of two or more distinct epitaxial layers, within the semiconductor body 102.

The semiconductor material used to form the layers of first device region 108 can be any semiconductor material having a wide bandgap or any semiconductor material having a similar bandgap as the semiconductor material of the second device region 110. According to an embodiment, the substrate 136, the field stop layer 138 and the drift layer 140 are each formed from SiC.

After forming the first device region 108, the drift current control region 114 can be formed at a top surface 144 of the drift layer 140 that is opposite from the substrate 136. According to an embodiment, a doped well 142 of the second conductivity type is formed in the drift layer 140. The doped well 142 can be formed by introducing dopants (e.g., by implantation) into the top surface 144, for example. According to an embodiment, an integrated dopant concentration of the doped well 142 is higher than an integrated dopant concentration of the first vertical section 132. The integrated dopant concentration is measured in a lateral direction that is parallel to the top surface. This allows the current in the first vertical section 132 to be pinched off, and thus provide a controllable JFET device. Optionally, first conductivity type dopants can also be implanted into the top surface 144 so as to form the first vertical section 132 with a higher doping concentration than subjacent portions of the drift region 112.

After forming the first device region 108, the second device region 110 may be formed by another epitaxial growth process in which semiconducting material is epitaxially grown on the first device region 108. According to an embodiment, a nucleation layer 145 is formed on the SiC material of the first device region 108. The nucleation layer 145 includes a metallic nitride material (e.g., AlN) that enables the epitaxial growth of type-III semiconductor nitride material (e.g., GaN) thereon. Subsequently, the second device region 110 is formed on the nucleation layer 145. One embodiment of this epitaxial growth process includes epitaxially growing an intrinsic (i.e., undoped) layer of semiconductor material on the nucleation layer 145. This intrinsic layer forms the buffer layer 118. Subsequently, a doped layer of semiconductor material is epitaxially grown on the intrinsic layer. This doped layer forms the barrier layer 116. The intrinsic and doped layers of semiconductor material collectively form a second compound epitaxial layer of the semiconductor body 102.

The second device region 110 can be made from any of a variety of semiconductor materials suitable for manufacturing semiconductor devices, and in particular those materials suitable for manufacturing high electron mobility semiconductor devices. According to an embodiment, the buffer layer 118 is an epitaxial layer of undoped GaN. Alternatively, the buffer layer 118 can be intentionally doped, e.g., with Carbon or Iron to increase the overall breakdown strength and minimize leakage. the barrier layer 116 can be an epitaxial layer of AlGaN, for example.

In general, III-V semiconductor materials, such as GaN, are used to form high electron mobility semiconductor devices. With GaN technology, the presence of polarization charges and strain effects result in the realization of a two-dimensional charge carrier gas, which is a two-dimensional electron or hole inversion layer characterized by very high carrier density and carrier mobility. A two-dimensional charge carrier gas such as a 2DEG (two-dimensional electron gas) or 2DHG (two-dimensional hole gas) forms the channel region of the device. A thin, e.g. 1-2 nm, AlN layer can be provided between the GaN buffer layer 118 and the alloy barrier layer 116 to minimize alloy scattering and enhance 2DEG mobility. Other combinations of III-V semiconductor materials can be used in order to form a 2DEG or 2DHG channel region, as is well known in the art. In general, any heterostructure can be used where a band discontinuity is responsible for the device concept. For example with an AlGaAs system there is no piezoelectric effect, but a confinement concept which involves arranging quantum wells for confinement of the channel region is possible.

After forming the second device region 110, additional layers may be formed on the first lateral surface 104 of the semiconductor body 102. For example, one or more passivation layers 119 may be formed on the first lateral surface 104. The passivation layer 119 may be formed from any of a variety of dielectric insulators, such as an oxide material or nitride-based dielectrics.

The substrate contact 122 and the first output contact 128 may be formed by a sequence of etching and deposition. According to an embodiment, a mask (not shown) is provided on the passivation layer 119. Subsequently, a masked etching technique is carried out to define the contact holes that are used to form the substrate contact 122 and the first output contact 128. The etching process may be carried out such that these contact holes extend through the barrier layer 116 and through the buffer layer 118. As a result, a bottom of the contact hole that forms the substrate contact 122 is disposed in the drift layer 140 and a bottom of the contact hole that forms the first output contact 128 is disposed in the drift current control region 114. The highly doped contact region 124 may be formed, e.g., by implanting dopants into the bottom of the contact hole that forms the substrate contact 122. This implantation step can be done prior to the epitaxial growth of the second device region 110, due to the high temperatures associated with dopant activation. A similar process may be carried out to enhance the contact resistance of the first output contact 128. The substrate contact 122 and the first output contact 128 may be formed by depositing a conductive material, such as a metal or polysilicon, into the contact holes.

The gate electrode 126 and the second output contact 130 can be formed according to any of a variety of known techniques including, but not limited to, deposition, electroplating and masked etching.

Figure 2:
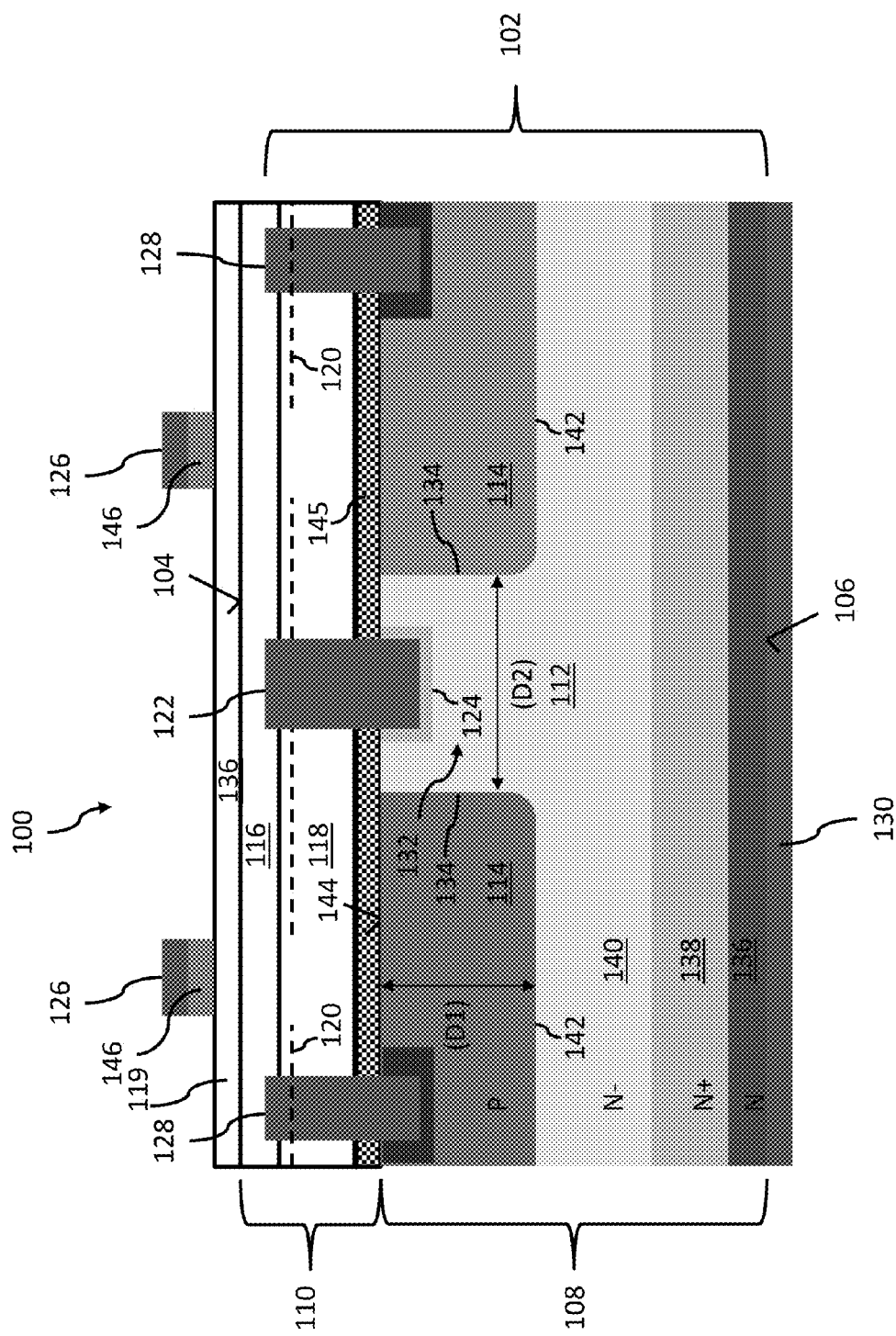
FIG. 2 illustrates a quasi-vertical transistor that includes a vertical JFET and a normally-off lateral high-electron-mobility transistor, according to an embodiment.
Figure 3:
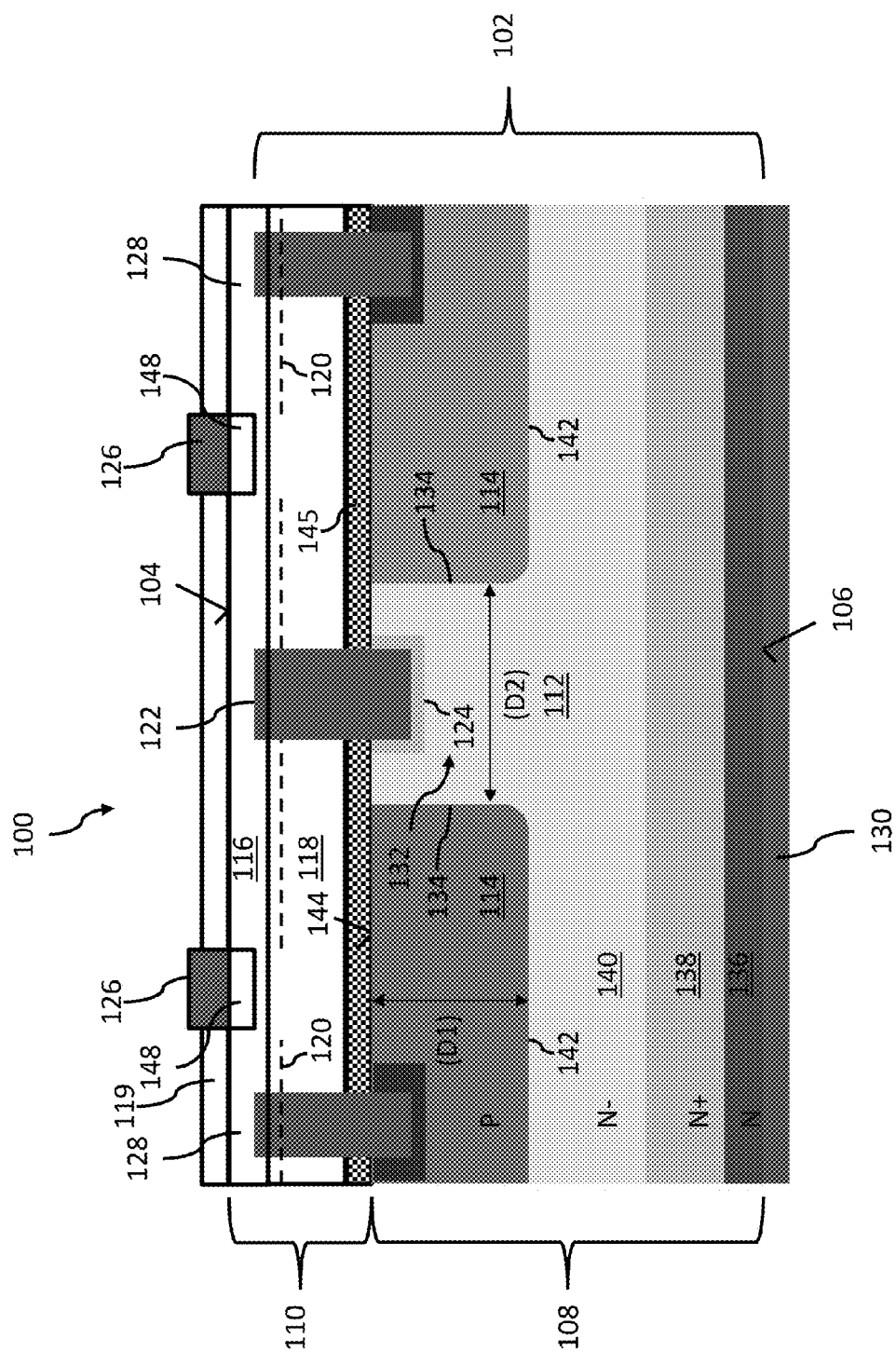
FIG. 3 illustrates a quasi-vertical transistor that includes a vertical JFET and a normally-off lateral high-electron-mobility transistor, according to another embodiment.
Figure 4:
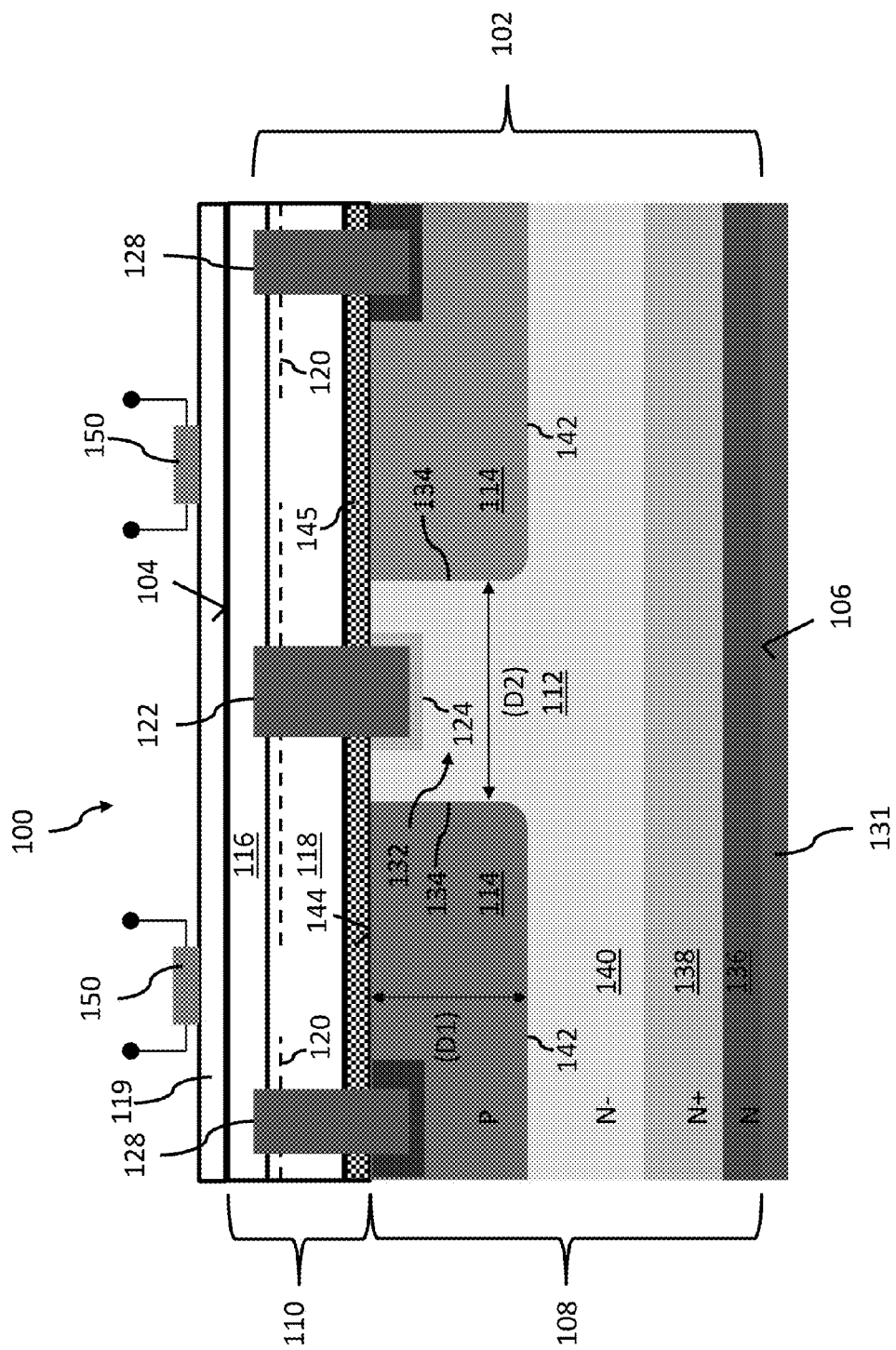
FIG. 4 illustrates a quasi-vertical transistor that includes a vertical JFET and a normally-off lateral high-electron-mobility transistor, according to another embodiment.

FIGS. 2-4 depict additional embodiments of the semiconductor device 100. In each case, the semiconductor device 100 may be identical to the semiconductor device 100 of FIG. 1, with the exception of the gate configuration of the lateral HEMT. The HEMT of FIG. 1 is configured as a "normally-on" or negative threshold voltage device. That is, in the absence of any bias applied to the gate electrode 126, the two-dimensional charge carrier gas channel 120 is electrically conductive, due to the fact that the two-dimensional charge carrier gas is automatically present between the barrier and buffer layers 116, 118 in an unbiased condition. In the semiconductor devices 100 of FIGS. 2-4, the lateral HEMT is configured as a "normally-off" or positive threshold voltage device. That is, the HEMT is configured such that the two-dimensional charge carrier gas channel 120 is in a non-conductive state when the semiconductor device 100 is at zero gate bias. The gate bias refers to a potential that is measured between the gate electrode 126 and the first output contact 128. This "normally-off" aspect can be achieved by incorporating features into the gate structure of the HEMT, for example.

Referring to FIG. 2, the gate structure of the HEMT includes a doped region 146 of semiconductor material interposed between the gate electrode 126 and the two-dimensional charge carrier gas channel 120. In an embodiment in which the barrier and buffer layers 116, 118 are formed from GaN and AlGaN, respectively, the doped region 146 may be a layer of p-type GaN (or AlGaN), for example. The doping concentration and separation distance (relative to the of the doped region 146 two-dimensional charge carrier gas channel 120) of the doped region 146 can be tailored such that the two-dimensional charge carrier gas channel 120 is non-conductive at zero gate bias, due to an electric field generated by the doped region 146.

Referring to FIG. 3, the HEMT is configured with a recessed gate structure. More particularly, a recess has been formed (e.g., by masked etching) in the first lateral surface 104 of the semiconductor body 102. The recess extends through the passivation layer 119 and into the barrier layer 116. The recess can extend partially or completely through the barrier layer 116. The absence of a section of the barrier layer 116 locally disrupts the two-dimensional charge carrier gas channel 120 in a region that is directly beneath the recess. A dielectric insulator 148, such as an oxide, is interposed between the gate electrode 126 and the two-dimensional charge carrier gas channel 120. The HEMT can be turned on by applying an electric field across the dielectric insulator 148 (i.e., applying a gate-source bias) to draw carriers into the depleted region of the two-dimensional charge carrier gas channel 120 and therefore complete the electrical connection between the first output contact 128 and the substrate contact 122.

Referring to FIG. 4, the gate structure of the HEMT includes a piezoelectric region 150. The piezoelectric region 150 is formed at or near the first lateral surface 104, over the two-dimensional charge carrier gas channel 120. Rather than controlling the conductive state of the two-dimensional charge carrier gas channel 120 by an electric field mechanism, as is the case in most HEMT designs, the gate structure of FIG. 5 utilizes mechanical stresses to influence the two-dimensional charge carrier gas channel 120. In an unbiased state, the piezoelectric region 150 may apply a mechanical stress to the semiconductor body 102, depending on the configuration of the piezoelectric region 150. This mechanical stress propagates to the two-dimensional charge carrier gas channel 120 and disrupts the intrinsic conductive connection between the first output contact 128 and the substrate contact 122. The HEMT can be turned on by applying an electric field to the piezoelectric region 150 that removes the mechanical stress applied by the piezoelectric region 150 and re-establishes the electrical connection between the first output contact 128 and the substrate contact 122.

Figure 5:
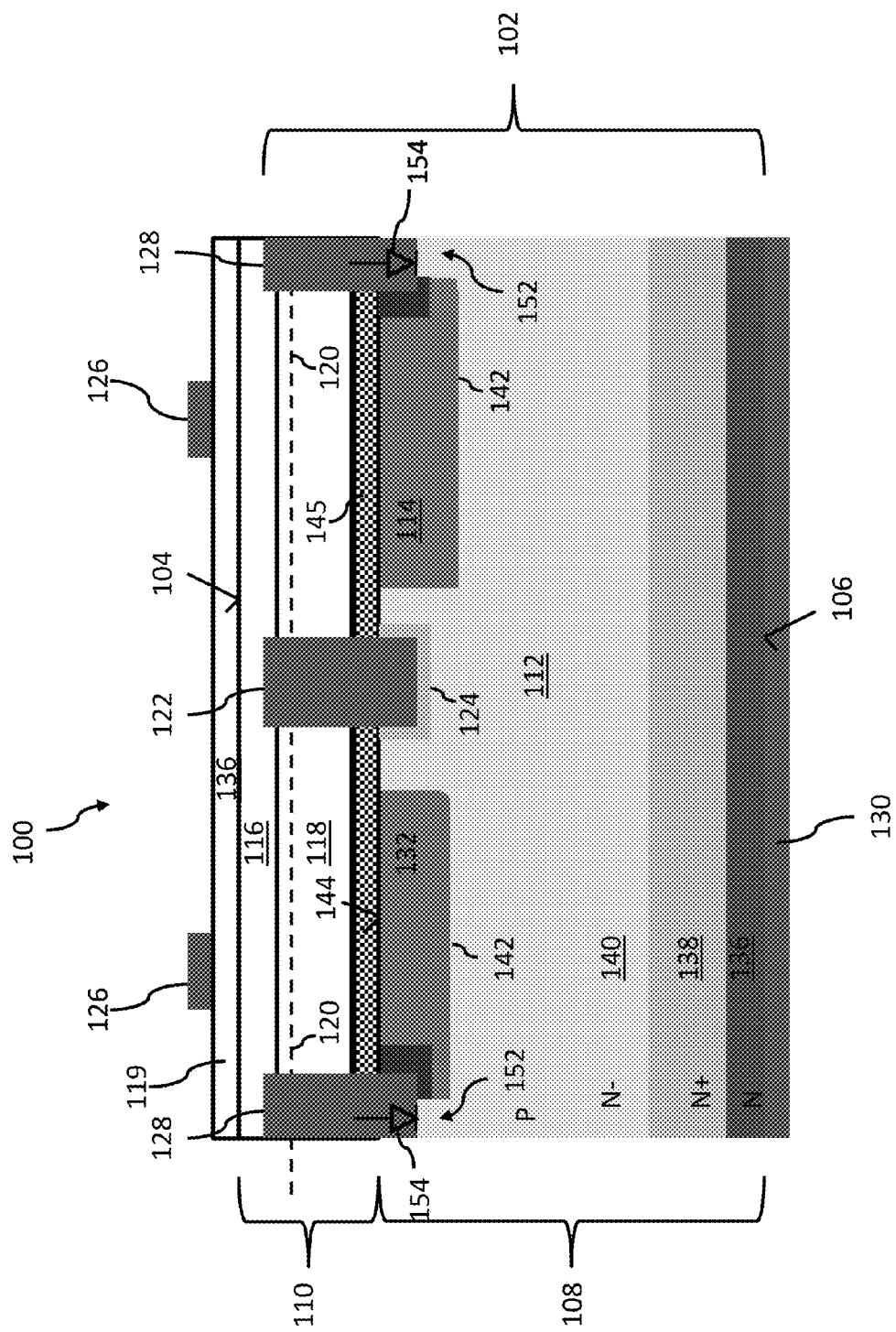
FIG. 5 illustrates a quasi-vertical transistor that includes a vertical JFET and a lateral high-electron-mobility transistor with an integrated Schottky diode, according to an embodiment.

FIG. 5 depicts a further embodiment of the semiconductor device 100. The semiconductor device 100 may be identical to the semiconductor device 100 of FIG. 1, with the exception of the configuration and geometry of the drift current control region 114. In the embodiment of FIG. 1, the drift current control region 114 extends completely across a bottom side of the first output contact 128. Thus, there is no direct contact between the first output contact 128 and the drift region 112. In the embodiment of FIG. 5, the drift current control region 114 only partially extends across a bottom side of the first output contact 128 such that a portion of the first output contact 128 directly contacts the drift region 112. In this configuration, a second vertical section 152 of the drift region 112 extends to the first output contact 128. The second vertical section 152 of the drift region 112 forms a Schottky junction with the first output contact 128. Thus, a low forward-bias Schottky diode 154 is connected between the source and drain electrodes of the quasi-vertical transistor.

Some of the advantages of quasi-vertical transistor described herein will now be discussed. One notable advantage of the quasi-vertical transistor is that most of the reverse blocking capability is attributed to the vertical JFET and not the lateral HEMT. When the device 100 is in a reverse blocking mode, most of the potential is distributed across the drift region 112. The "drain" of the lateral HEMT, which is provided by the substrate contact 122, is shielded from the electric field that develops in the drift region 112. For example, according to an embodiment, the drift current control region 114 extends underneath the second device region 110 for at least fifty percent of the lateral length of the two-dimensional charge carrier gas channel 120. This shielding effect produced by the by the drift current control region 114 protects the buffer layer 118 from the potentially destructive electric fields that can develop in the drift region 112 under large reverse biases. Thus, the lateral HEMT need not be designed to withstand large blocking voltages. Meanwhile, the advantageous properties of the lateral HEMT can be utilized to provide a power semiconductor device 100 that has fast switching times, low $R_{DSON}$ and is hardened against current collapse. These attributes of HEMT devices are superior to, for example, a conventional SiC MOSFET, because SiC technology suffers from the drawback of relatively higher $R_{DSON}$, due to the relatively low mobility of carriers in the inversion channel formed along $SiO_2$—SiC interface of the device.

The relatively thick drift region 112 and advantageous physical properties of SiC material that are used to form the JFET produce a device that is able to withstand substantial voltages. The JFET can withstand any voltages it is designed for—above 600 V or more, for example—before experiencing an avalanche breakdown condition, which is a substantial limiting factor with respect to voltage blocking capability. Further, the parameters of the JFET can be tailored for optimal reverse blocking capability without any modification to the parameters of the lateral HEMT. Exemplary parameters of the JFET that influence reverse blocking capability include, thickness of the drift region 112, doping concentration of the drift current control region 114, depth of the well 142 ((D1) as shown in FIG. 1) that forms the drift current control region 114, and separation distance ((D2) as shown in FIG. 1) between adjacent ones the of drift current control regions 114, for example.

A further advantage of the device 100 relates to scalability. For example, a particular application requirement (e.g., reverse voltage rating, $R_{DSON}$, etc.) can be achieved by simply adjusting the parameters of the JFET without any modification to the lateral HEMT. That is, the JFET can be scaled while the features and corresponding performance of the lateral HEMT remain intact. The design therefore provides a cost-effective template that is adaptable to a variety of different applications at minimal design cost.

Because the bulk of the reverse blocking capability of the quasi-vertical transistor is attributed to the JFET, the lateral HEMT can be optimized for other considerations, such as on-state performance and cost. For example, the thickness of the buffer layer 118 can be substantially reduced in comparison to an HEMT of comparable reverse blocking rating grown in a commonly known way on silicon or silicon-carbide substrates. According to an embodiment, the buffer layer 118 has a thickness (as measured in the vertical direction) of less 2 μm, such as 1 μm. In this embodiment, the parameters of the JFET can be tailored to achieve an overall reverse blocking rating for the quasi-vertical transistor of at least 600V. By comparison, a comparable reverse blocking rating in a conventional lateral HEMT, i.e., a lateral HEMT device that does not include the SiC based JFET structure incorporated into the substrate in the manner described herein, requires a thickness for the buffer layer 118 of approximately 6 μm. This reduction in the thickness of the buffer layer 118 also advantageously reduces the time and expense required to manufacture the device.

The quasi-vertical transistor can be easily manufactured to include a body diode with a low forward voltage drop. As explained with reference to the embodiment of FIG. 5, the rectifying junction between the second vertical section 152 of the drift layer 140 and the first output contact 128 provides a Schottky diode 154 for the device. This Schottky diode 154 provides a low forward bias built-in diode between the source and drain of the quasi-vertical transistor. Due to the properties of SiC and the low doping concentration of the drift layer 140, the forward voltage drop can be in the range of about 1 V, for example. By contrast, body diodes that are formed in conventional HEMT devices typically have a forward voltage drop of at least 3V.

Figure 6:
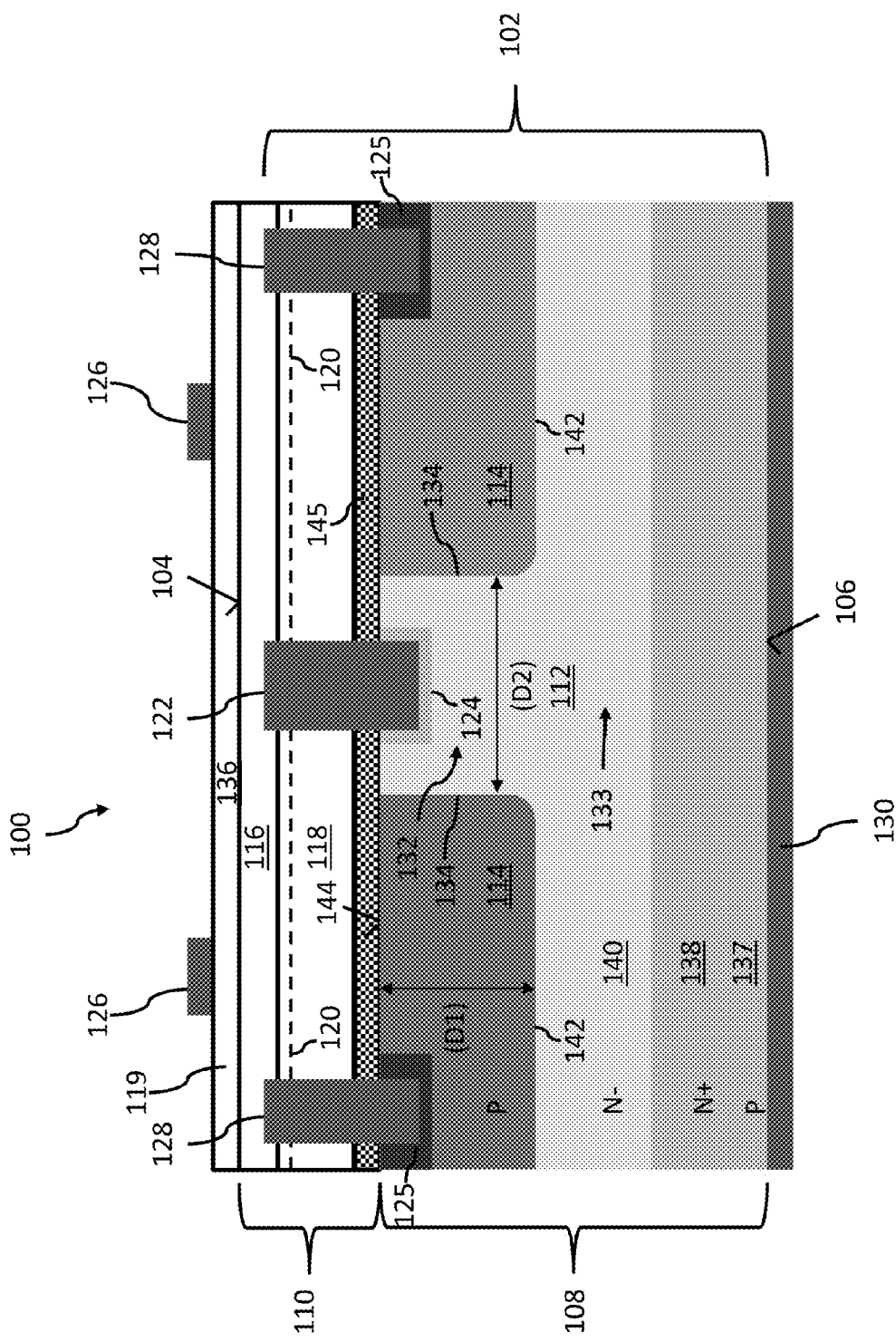
FIG. 6 illustrates a quasi-vertical transistor that includes a vertical JFET and a lateral high-electron-mobility transistor, according to another embodiment.

FIG. 6 depicts a semiconductor device 100, according to another embodiment. The semiconductor device 100 is identically configured as the semiconductor device 100 of FIG. 1, with the exception of the doping type of the lowermost layer in the semiconductor device 100. In the semiconductor device 100 of FIG. 6, a second conductivity type layer 137 (e.g., a p-type layer) is disposed between the drift layer 140 and the lowermost output contact 131. The second conductivity type layer 137 extends to the second lateral surface 106 and thus directly contacts lowermost output contact 131 By incorporating the second conductivity type layer 137 into the semiconductor device 100 (in addition to or in lieu of the first conductivity type substrate 136), a bipolar transistor device can be realized, wherein the second conductivity type layer 137 provides a collector side of the device and the lowermost output contact 131 provides a collector terminal.

Figure 7:
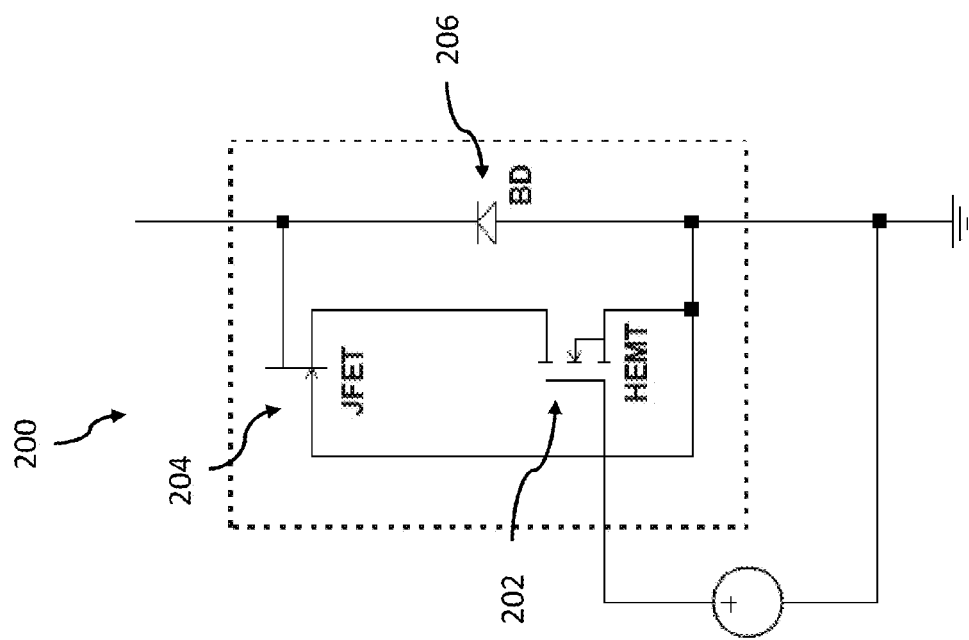
FIG. 7 schematically illustrates a circuit that includes a JFET and a high-electron-mobility transistor with the JFET and the high-electron-mobility transistor being connected in a cascode configuration, according to an embodiment.

FIG. 7 schematically represents a circuit 200 that includes an HEMT 202 and a JFET 204, according to an embodiment. The circuit 200 may be formed from the semiconductor device 100 according to any one of the embodiments described herein, with the HEMT 202 being provided by the lateral HEMT and the JFET 204 being provided by the vertical JFET that is integrated in the same substrate. In the circuit 200 of FIG. 7, the HEMT 202 and JFET 204 are arranged in a cascode configuration. That is, the circuit 200 has a common-emitter or common-source stage provided by the lateral HEMT, for example, combined with a common-base or common-gate stage provided by the JFET, for example. The circuit 200 further includes a body diode 206 connected between output terminals of the JFET 204 and the high-electron-mobility transistor 202. The body diode 206 may be provided by the low forward-bias Schottky diode 154 described herein.

The pinch-off voltage of the JFET 204 is lower than the breakdown voltage of the HEMT 202. This prevents the HEMT 202 from entering an avalanche condition and thus the breakdown voltage of the circuit 200 is highly controllable. Furthermore, the mobility of carriers in the channel of the HEMT 202 is greater than the mobility of carriers in the channel of the JFET 204. Furthermore, the leakage current of the HEMT 202 is higher than the leakage current of the JFET 204. These properties are attributable to the intrinsic characteristics of the materials used to form the JFET 204 and the HEMT 202 (e.g., SiC and GaN, respectively) and/or appropriate parameterization of physical properties of the JFET 204 and the HEMT 202 (e.g., doping concentrations, layer thicknesses, separation distances, etc.). Before the JFET 204 and the HEMT 202 can enter a blocking state, both of the output capacitances of these two devices must charge. The leakage of each device is an equivalent resistance that is in parallel with these output capacitances. The output voltage of the HEMT 202 will rise as soon as the output capacitance is fully charged. In this state, the breakdown voltage of the HEMT 202 can be easily reached, which damages the HEMT 202. Advantageously, the HEMT can be configured with a relatively large leakage current so as to avoid this breakdown condition.

The term HEMT is also commonly referred to as HFET (heterostructure field effect transistor), MODFET (modulation-doped FET) and MESFET (metal semiconductor field effect transistor). The terms HEMT, HFET, MESFET and MODFET are used interchangeably herein to refer to any III-nitride based compound semiconductor transistor incorporating a junction between two materials with different band gaps (i.e., a heterojunction) as the channel. For example, GaN may be combined with AlGaN or InGaN to form an electron gas inversion region as the channel. The compound semiconductor device may have AlInN/AlN/GaN barrier/spacer/buffer layer 118 structures. In general, the normally-off compound semiconductor transistor can be realized using any suitable III-nitride technology such as GaN that permits the formation of opposite polarity inversion regions due to piezoelectric effects.

The term "in ohmic contact" or "electrically connected" or "in electrical contact" describes a permanent, non-rectifying electrical junction between two conductors that has linear current-voltage (I-V) characteristics, as with Ohm's law. By contrast, the term "electrically coupled" means that one or more intervening element(s) configured to influence the electrical signal in some tangible way is be provided between the electrically coupled elements. These intervening elements include active elements, such as transistors, as well as passive elements, such as inductors, capacitors, diodes, resistors, etc.

The term "lateral" as used in this specification intends to describe an orientation substantially parallel to a first or main surface of a semiconductor substrate or body. This can be for instance the surface of a wafer or a die.

The term "vertical" as used in this specification intends to describe an orientation that is substantially arranged perpendicular to the first surface, i.e. parallel to the normal direction of the first surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor device s can be formed with opposite doping relations so that the first conductivity type can be p-doped and the second conductivity type can be n-doped. Furthermore, some figures illustrate relative doping concentrations by indicating "−" or "+" next to the doping type. For example, "n" means a doping concentration that is less than the doping concentration of an "n"-doping region while an "n+"-doping region has a larger doping concentration than the "n"-doping region. However, indicating the relative doping concentration does not mean that doping regions of the same relative doping concentration have to have the same absolute doping concentration unless otherwise stated. For example, two different n$^+$-doping regions can have different absolute doping concentrations. The same applies, for example, to an n$^+$-doping and a p$^+$-doping region.

The term "power semiconductor device" as used in this specification intends to describe a semiconductor device on a single chip with high voltage and/or high current switching capabilities. In other words, power semiconductor devices are intended for high current, typically in the range of one or more Amperes and/or high voltages, typically above 100 V, more typically above 400 V.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first," "second," and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A semiconductor device, comprising:
   a semiconductor body comprising a first lateral surface and a second lateral surface opposite the first lateral surface;
   a first device region extending to the second lateral surface, and comprising: a drift region of a first conductivity type, and a drift current control region of a second conductivity type that is opposite the first conductivity type, the drift current control region being spaced apart from the second lateral surface by the drift region;
   a second device region extending to the first lateral surface, and comprising: a barrier layer, and a buffer layer having a different band gap than the barrier layer and a two-dimensional charge carrier gas channel at an interface between the buffer layer and the barrier layer;
   an electrically conductive substrate contact forming a low ohmic connection between the two-dimensional charge carrier gas channel and the drift region; and
   a gate structure being configured to control a conduction state of the two-dimensional charge carrier gas,
   wherein the drift current control region is configured to block a vertical current in the drift region via a space-charge region that arises at a p-n junction between the drift current control region and the drift region.

2. The semiconductor device of claim 1, wherein the electrically conductive substrate contact extends from the first lateral surface through the second device region and into the first device region, wherein a first vertical section of the drift region that is laterally adjacent to the drift current control region is in ohmic contact with the electrically conductive substrate contact, and wherein the p-n junction between the drift current control region and the drift region adjoins the first vertical section of the drift region such that the space-charge region laterally extends across the first vertical section of the drift region.

3. The semiconductor device of claim 2, wherein a doping concentration of the first vertical section is at least two times higher than a doping concentration of a subjacent portion of the drift region.

4. The semiconductor device of claim 2, wherein the first device region comprises:
   a substrate of the first conductivity type adjoining the second lateral surface; and
   a first compound epitaxial layer being formed on the substrate and comprising:
      a doped field stop layer of the first conductivity type; and
      a doped drift layer of the first conductivity type being formed on the doped field stop layer,
   wherein the drift current control region is a doped well that extends from a first side of the drift layer that is opposite from the second lateral surface.

5. The semiconductor device of claim 4, wherein the second device region comprises:
   a second compound epitaxial layer being formed on the first device region, and comprising
      a nucleation layer formed on the first device region;
      a first layer of semiconductor material formed on the nucleation layer; and
      a second layer of semiconductor material formed on the first layer of semiconductor material.

6. The semiconductor device of claim 5, wherein the substrate, the field stop layer and the drift layer are each formed from SiC, wherein the first layer of semiconductor material is formed from GaN and wherein the second layer of semiconductor material is formed from AlGaN.

7. The semiconductor device of claim 2, further comprising:
   a first electrically conductive output contact disposed on the first lateral surface and in ohmic contact with the two-dimensional charge carrier gas channel and the drift current control region; and
   a second electrically conductive output contact disposed on the second lateral surface and in ohmic contact with the drift region.

8. The semiconductor device of claim 7, wherein the drift current control region extends underneath the second device region for at least 50% of a lateral length of the two-dimensional charge carrier gas.

9. The semiconductor device of claim 7, wherein a second vertical section of the drift region is in ohmic contact with the first electrically conductive output contact and forms a rectifying junction with the first electrically conductive output contact.

10. The semiconductor device of claim 7, wherein the gate structure comprises an electrically conductive gate electrode, and wherein the gate structure is configured to place the two-dimensional charge carrier gas channel in a non-conductive state when the semiconductor device is at zero gate bias, the gate bias being measured between the gate electrode and the first electrically conductive output contact.

11. The semiconductor device of claim 10, further comprising a doped region of semiconductor material interposed between the gate electrode and the two-dimensional charge carrier gas channel, wherein the doped region is configured to generate electric field that places the two-dimensional charge carrier gas channel in the non-conductive state at zero gate bias.

12. The semiconductor device of claim 10, wherein the gate structure comprises an insulating region interposed between the gate electrode and the two-dimensional charge carrier gas channel, and wherein the gate electrode is formed in a recessed portion of the barrier layer.

13. The semiconductor device of claim 10, wherein the gate structure comprises a piezoelectric region that is configured to apply mechanical force to the second device region responsive to the gate bias, and wherein the piezoelectric region applies mechanical force to place the two-dimensional charge carrier gas channel in the non-conductive state at zero gate bias.

14. The semiconductor device of claim 2, wherein the first device region comprises:
a substrate layer of the second conductivity type adjoining the second lateral surface; and
a first compound epitaxial layer being formed on the substrate layer and comprising:
a doped field stop layer of the first conductivity type; and
a doped drift layer of the first conductivity type being formed on the doped field stop layer.

15. A transistor arrangement, comprising:
a semiconductor body comprising a first lateral surface and a second lateral surface opposite the first lateral surface;
a vertical JFET, comprising: a first conductivity type drift region, and a drift current control region of a second conductivity type that is opposite the first conductivity type;
a lateral high-electron-mobility transistor, comprising: a barrier layer, and a buffer layer having a different band gap than the barrier layer so that a two-dimensional charge carrier gas arises along an interface between the buffer layer and the barrier layer;
an electrically conductive substrate contact forming an ohmic connection between the two-dimensional charge carrier gas and the drift region;
an HEMT gate that is configured to control a lateral current in the two-dimensional charge carrier gas channel, and
a JFET gate that is configured to control a vertical current in the drift region.

16. The transistor arrangement of claim 15, wherein a pinch-off voltage of the JFET is lower than a breakdown voltage of high-electron-mobility transistor.

17. The transistor arrangement of claim 15, further comprising:
a first electrically conductive output contact disposed on the first lateral surface and in ohmic contact with the two-dimensional charge carrier gas channel and the drift current control region; and
a second electrically conductive output contact disposed on the second lateral surface and in ohmic contact with the drift region,
wherein the HEMT gate is arranged on the first lateral surface,
wherein the JFET gate comprises the drift current control region.

18. The transistor arrangement of claim 15, further comprising a Schottky diode electrically connected between the first and second electrically conductive electrodes.

19. The transistor arrangement of claim 15, wherein the buffer layer has a thickness of less than or equal to 1 µm, and wherein the transistor has a reverse blocking rating of at least 600V.

20. The transistor arrangement of claim 15, further comprising:
a diode connected between a drain of the vertical JFET and a source of the lateral high-electron-mobility transistor;
wherein a drain of the lateral high-electron-mobility transistor is connected to a source of the vertical JFET,
wherein the JFET gate is connected to the source of the at To high-electron-mobility transistor, and
wherein a pinch-off voltage of the JFET is lower than a breakdown voltage of the high-electron-mobility transistor.

21. The transistor arrangement of claim 20, wherein the mobility of carriers in a channel of the lateral high-electron-mobility transistor is greater than the mobility of carriers in a channel of the vertical JFET.

22. The transistor arrangement of claim 20, wherein a leakage current of the
lateral high-electron-mobility transistor is higher than a leakage current of the vertical JFET.

23. A method of forming a semiconductor device in a semiconductor body comprising a first lateral surface and a second lateral surface opposite the first lateral surface, the method comprising:
forming a first device region, comprising: a drift region of a first conductivity type, and a drift current control region of a second conductivity type that is opposite the first conductivity type, the drift current control region being spaced apart from the second lateral surface by the drift region;
forming a second device region on the first device region and comprising: a barrier layer, and a buffer layer having a different band gap than the barrier layer and a two-dimensional charge carrier gas channel arises at an interface between the buffer layer and the barrier layer;
forming an electrically conductive substrate contact in the semiconductor body, the electrically conductive substrate contact forming an ohmic connection between the two-dimensional charge carrier gas channel and the drift region; and
forming a gate structure on the semiconductor body, the gate structure being configured to control a conduction state of the two-dimensional charge carrier gas,
wherein the first device region adjoins the second lateral surface and the second device region adjoins the first lateral surface, and
wherein the drift current control region is formed such that a space-charge region that arises at a p-n junction between the drift current control region and the drift region is configured to block a vertical current in the drift region.

24. The method of claim 23, wherein forming the first device region comprises:
providing a first conductivity type substrate; and
growing a first compound epitaxial layer on the substrate, wherein growing the first compound epitaxial layer comprises:
epitaxially growing a highly doped first conductivity type field stop layer on the first conductivity type substrate; and
epitaxially growing a lightly doped first conductivity type drift layer on the highly doped first conductivity type field stop layer, and wherein the drift current control region is formed in the drift layer by forming a doped well at a first side of the drift layer that directly adjoins the buffer layer.

25. The method of claim 24, wherein forming the second device region comprises:
  growing a second compound epitaxial layer of semiconductor material on the first device region, wherein growing the second compound epitaxial layer comprises:
    epitaxially growing a layer of semiconductor material on the drift layer; and
    epitaxially growing a doped layer of material on the layer of semiconductor material.

26. The method of claim 24, wherein the substrate, the field stop layer and the drift layer are each formed from SiC, wherein the layer of semiconductor material is formed from GaN, and wherein the doped layer of semiconductor material is formed from AlGaN.

27. The method of claim 23, wherein forming the electrically conductive substrate contact in the semiconductor body comprises etching a contact hole extending through the buffer and barrier layers such that a bottom of the contact hole adjoins the drift region; and depositing an electrically conductive material in the contact hole.

* * * * *

UNITED STATES PATENT AND TRADEMARK OFFICE
CERTIFICATE OF CORRECTION

| | |
|---|---|
| PATENT NO. | : 9,570,438 B1 |
| APPLICATION NO. | : 14/817835 |
| DATED | : February 14, 2017 |
| INVENTOR(S) | : G. Curatola et al. |

It is certified that error appears in the above-identified patent and that said Letters Patent is hereby corrected as shown below:

In the Claims

Claim 20, (Column 16, Line 12), please replace "at To" with --lateral--.

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*